United States Patent [19]

Carmody

[11] 4,109,196

[45] Aug. 22, 1978

[54] RESISTANCE MEASURING CIRCUIT

[75] Inventor: Joseph P. Carmody, Willow Grove, Pa.

[73] Assignee: Honeywell Inc., Minneapolis, Minn.

[21] Appl. No.: 747,422

[22] Filed: Dec. 3, 1976

[51] Int. Cl.² ............................................. G01R 27/02
[52] U.S. Cl. .................................. 324/62; 73/362 AR; 324/123 C
[58] Field of Search ...................... 324/62, 123 C, 124; 73/362 AR; 323/7, 9, 4 R

[56] References Cited

U.S. PATENT DOCUMENTS

| | | | |
|---|---|---|---|
| 3,411,081 | 11/1968 | Schulz | 324/62 |
| 3,437,925 | 4/1969 | Gillette | 324/62 |
| 3,568,044 | 2/1971 | Elazar | 324/62 X |
| 3,817,104 | 6/1974 | Sapir | 73/362 A |
| 3,913,403 | 10/1975 | Arcara | 73/362 A |

FOREIGN PATENT DOCUMENTS

| | | | |
|---|---|---|---|
| 2,122,561 | 11/1972 | Fed. Rep. of Germany | 324/62 |
| 390,472 | 1/1974 | U.S.S.R. | 324/62 |
| 384,077 | 8/1973 | U.S.S.R. | 324/62 |

*Primary Examiner*—Stanley T. Krawczewicz
*Attorney, Agent, or Firm*—Laurence J. Marhoefer; Lockwood D. Burton; Mitchell J. Halista

[57] ABSTRACT

A resistance measuring circuit for providing an output signal which is linearly proportional to the difference in resistance between two unknown resistances. The measuring circuit includes a constant current source for driving both unknown resistances in a series circuit by connecting the series circuit in a feedback loop of an operational amplifier. The voltage drops across the unknown resistances are applied to the inverting and non-inverting inputs of a second operation amplifier used as a differential amplifier, respectively. The effect of leadwire resistance to the unknown resistances is cancelled by the subtractive operation of the second amplifier. Further, the first amplifier is supplied with a variable input signal to provide a zero suppression capability for the linear output signal.

10 Claims, 1 Drawing Figure

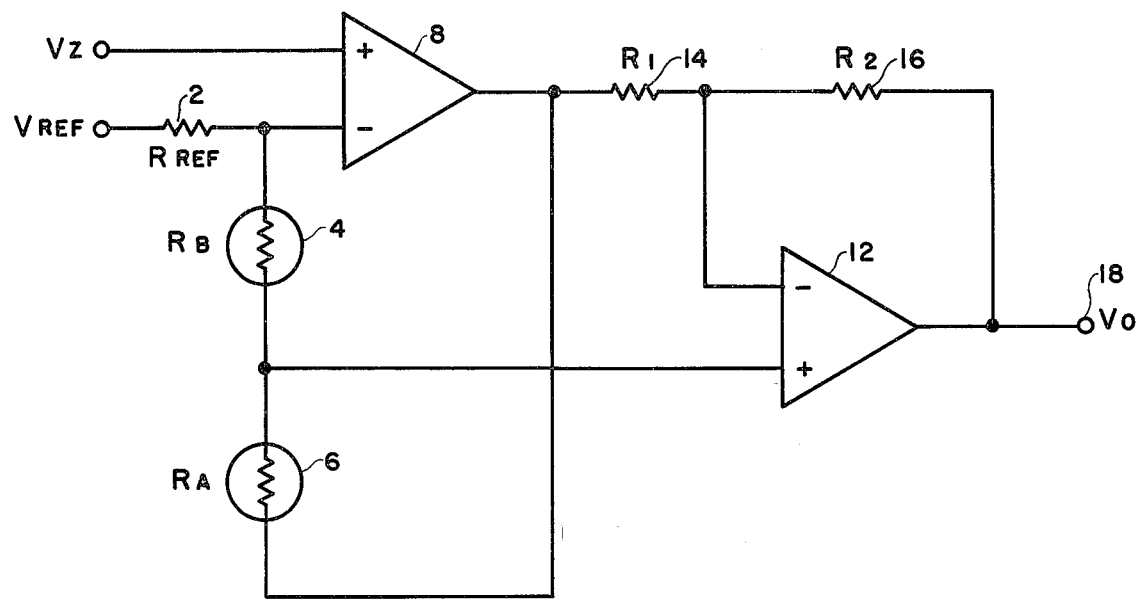

RESISTANCE MEASURING CIRCUIT

BACKGROUND OF THE INVENTION

1. Field of the Invention

The present invention relates to resistance measurement. More specifically, the present invention is directed to a measuring circuit for measuring the difference in resistance between two resistors.

2. Description of the Prior Art

The measurement of an unknown parameter by the use of a parameter responsive resistance is a technique used in many applications, e.g., temperature measurement, using resistance temperature bulbs. Accordingly, it is desirable to provide a direct method of measuring the resistance of a resistive element which may, as in the case of a resistance temperature bulb, be representative of the temperature detected by the resistive element. Typically, the prior art circuits for measuring such resistances have included a bridge circuit such as that shown in U.S. Pat. No. 3,817,104. Such a prior art bridge circuit while providing for a measurement of the resistance change of the unknown resistor produced an output voltage which was a non-linear function of the unknown resistance variations. Another prior art circuit for measuring such resistance variations has involved the use of two constant current power supplies for energizing the unknown resistor as shown in U.S. Pat. No. 3,913,403. This prior art technique while eliminating the non-linearity problem of the aforesaid bridge circuit introduced a new problem by requiring a precise matching and tracking of the two constant current sources. Further, neither of these prior art techniques afforded a convenient method for providing "zero suppression" of the output signal to produce a zero output signal at a desired resistance value of the measured resistance. Accordingly, it is desirable to provide a resistance measuring circuit for measuring resistance variations while providing a linear output and zero suppression while using only one constant current source.

SUMMARY OF THE INVENTION

An object of the present invention is to provide an improved resistance measuring circuit.

Another object of the present invention is to provide an improved resistance measuring circuit having a linear output representative of the measured resistance while eliminating the effect of leadwire resistance of the connecting wires from the measuring circuit to the unknown resistance.

A further object of the present invention is to provide an improved resistance measuring circuit for providing zero supression of an output signal having a linear relationship to the variations in the measured resistance.

In accomplishing these and other objects, there has been provided, in accordance with the present invention, a resistance measuring circuit having a single constant current source energizing a pair of unknown resistors connected in series. The voltage drops across the unknown resistors are applied to respective ones of the inverting and non-inverting inputs of a differential amplifier to produce an output signal having a linear relationship to the difference in resistance between the pair of unknown resistance.

BRIEF DESCRIPTION OF THE DRAWING

A better understanding of the present invention may be had when the following detailed description is read in connection with the accompanying single FIGURE drawing which is a schematic illustration of a resistance measuring circuit embodying the present invention.

DESCRIPTION OF THE PREFERRED EMBODIMENT

Detailed Description

Referring to the single FIGURE drawing in more detail, there is shown a resistance measuring circuit embodying the present invention and having a constant current supply arranged to supply a constant current from a reference source $V_{ref}$ through an input resistor 2 to a pair of unknown resistors 4 and 6 connected in series. A junction between the input resistor 2 and a first one of the series resistors 4, 6 is connected to the inverting input of a first operational amplifier 8. The other end of the series combination of the resistances 4 and 6 is connected to the output of the first amplifier 8 to form a negative feedback loop therewith. A variable voltage $V_Z$ is connected to the non-inverting input of the first operational amplifier 8. A junction between the serially connected pair of unknown resistors 4, 6 is connected to the non-inverting input of a second operational amplifier 12 used as a differential amplifier. The other end of the series combination of the resistances 4 and 6 is also connected through a second input resistor 14 to the inverting input of the second differential amplifier 12. A feedback resistor 16 is connected between the output of the second differential amplifier 12 and the inverting input thereof. The output of the second differential amplifier is also connected to an output terminal 18.

MODE OF OPERATION

The resistance measuring circuit of the present invention is used to provide an output voltage which is linearly proportional to the difference between the unknown resistances 4 and 6. One of these resistances may be a resistance thermometer bulb plus the resistance of the leadwires connected thereto while the other resistance may be either a fixed resistor with equivalent leadwire resistance or a second resistance thermometer bulb with its connecting leadwires.

Specifically, the output signal from the second, or output, differential amplifier 12 is the difference between the input signals applied to its inverting and non-inverting inputs as modified by the ratio of the input resistor 14 and the feedback resistor 16. Thus, using a specific example wherein the input resistor 14 equals the feedback resistor 16, the inverting input terminal gain is half of the non-inverting input terminal gain which produces an output terminal 18 as follows:

$$V_O = 2 V_1 - V_2$$

where $V_1$ is the non-inverting input signal and $V_2$ is the inverting input signal of the second amplifier 12.

The $V_1$ and $V_2$ input signals are derived from the serially connected unknown resistance elements 4 and 6. Thus, the voltage drop across the first resistance 4 is applied to the non-inverting input of the output amplifier 12 while the combined voltage drop across the first and second resistances 4 and 6 is applied to the inverting input of the output amplifier 12. In order to develop these signals $V_1$ and $V_2$ from the unknown resistance elements 4 and 6, these resistance elements 4 and 6 are connected in a negative feedback loop between the output and inverting input of the first differential amplifier 8. The resistance elements 4 and 6 are floating, i.e., ungrounded, so that they can be connected in this feedback loop. The input signal for the inverting input of the first amplifier 8 is a fixed reference signal $V_{Ref}$. The non-inverting input of the first amplifier 8 is supplied with an adjustable signal $V_Z$ which is used for "zero suppression" as discussed hereinafter. The feedback loop with the resistances 4 and 6 is effective to produce a constant current through the resistances 4 and 6 as defined by:

$$I = (V_{Ref} - V_Z/R_{Ref})$$

Since the aforesaid current I flows through the unknown resistances 4 and 6 and the operational amplifier 8 operates by means of its feedback to make the input signals equal, then effectively the signal at the inverting input of the first amplifier 8 is:

$$V_{Ref} - IR_{Ref} = V_Z$$

and the signal derived from the first resistance 4 is:

$$V_1 = V_Z - IR_B$$

while the signal derived from the second resistance 6 is:

$$V_2 = V_Z - IR_B - IR_A$$

Substituting these two last expressions in the above equation for the output signal yields:

$$V_O = 2 V_1 - V_2 = 2 (V_Z - IR_B) - (V_Z - IR_B - IR_A) = V_Z + IR_A - IR_B$$

$$V_O = V_Z + I (R_A - R_B)$$

which is a linear equation relating the output signal to the change in the difference in unknown resistances 4 and 6. Further, this relationship is free of the effect of leadwire resistance of the connections to the unknown resistance 4 and 6 if the leadwires are of a similar length to produce substantially equal voltage drops. These leadwire voltage drops cancel each other since they are applied to opposite sides of the output amplifier 12. If the unknown resistances 4 and 6 are equal, the output signal is dependent on $V_Z$ which provides a "zero suppression" capability that is defined as the resistance difference between the unknown resistors 4 and 6 that will produce a zero output signal on the output terminals 18. Thus, $V_Z$ can be adjusted to produce this zero output signal for a desired resistance difference using the above definition of the output signal $V_O$. The circuit of the present invention can also be used with a single unknown, or measuring, resistance by substituting a fixed resistance for the second resistor 6. In this case the output signal is defined by:

$$V_O = V_Z - IR_B$$

Accordingly, it may be seen that there has been provided, in accordance with the present invention an improved resistance measuring circuit for measuring the difference in resistance of a pair of unknown resistances to provide a linear output signal while having a zero suppression capability.

The embodiments of the invention in which an exclusive property or privilege is claimed are defined as follows:

1. A resistance measuring circuit comprising
   a constant current source means,
   a first resistance means,
   a second resistance means connected in series with said first resistance means across said constant current source means,
   a first differential amplifier means having a first input, a second input and an output, said amplifier having a second input gain which is twice a first input gain,
   first circuit means connecting a combined signal developed across both of said resistance means to said first input and
   second circuit means connecting a signal developed across one of said resistance means to said second input, whereby an output signal from said amplifier means is the difference between the signals applied to said first and second inputs.

2. A resistance measuring circuit as set forth in claim 1 wherein said first input is an inverting input and said second input is a non-inverting input.

3. A resistance measuring circuit as set forth in claim 2 wherein said constant current source includes a second differential amplifier means having an inverting input and a non-inverting input and wherein said first and second resistance means are connected in a feedback loop from an output of said second amplifier means to said inverting input of said second amplifier means and a reference signal source connected to said inverting input of said second amplifier means.

4. A resistance measuring circuit as set forth in claim 3 wherein said first differential amplifier means includes an operational amplifier having a negative feedback loop connected between an output thereof and said inverting input thereof.

5. A resistance measuring circuit as set forth in claim 3 and including an adjustable signal source connected to said non-inverting input of said second amplifier means.

6. A resistance measuring circuit as set forth in claim 1 wherein said first and said second resistance means each include a temperature responsive resistor.

7. A resistance measuring circuit as set forth in claim 1 wherein said constant current source includes a second differential amplifier having an inverting input and a non-inverting input and an output and wherein said first and second resistance means are connected in series in a feedback loop from the output of said second amplifier means to said inverting input of said second amplifier means, a source of a variable signal connected to said non-inverting input of said second amplifier means and a reference signal source connected to said inverting input of said second amplifier means.

8. A resistance measuring circuit as set forth in claim 7 wherein said first and second resistance means each include a temperature sensitive resistor and said variable signal from said variable source means is arranged to provide a zero level of said output signal on said output of said first amplifier means when said first resistor and said second resistor are of equal value.

9. A resistance measuring circuit as set forth in claim 1 wherein said first resistance means includes a temperature sensitive resistor and said second circuit means connects a signal developed across said resistor to said second input.

10. A resistance measuring circuit as set forth in claim 9 wherein said first input is an inverting input and said second input is a non-inverting input.

* * * * *